(12) United States Patent
Greeff et al.

(10) Patent No.: US 7,424,634 B2
(45) Date of Patent: Sep. 9, 2008

(54) SYSTEM AND METHOD FOR REDUCING JITTER OF SIGNALS COUPLED THROUGH ADJACENT SIGNAL LINES

(75) Inventors: Roy Greeff, Boise, ID (US); David Ovard, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 624 days.

(21) Appl. No.: 11/080,236

(22) Filed: Mar. 14, 2005

(65) Prior Publication Data

US 2006/0224342 A1    Oct. 5, 2006

(51) Int. Cl.
*G06F 1/12* (2006.01)
*H04L 7/00* (2006.01)
*H03L 7/06* (2006.01)

(52) U.S. Cl. .................. 713/401; 375/354; 327/158
(58) Field of Classification Search .................. 713/401
See application file for complete search history.

(56) References Cited

U.S. PATENT DOCUMENTS

| | | | |
|---|---|---|---|
| 4,481,625 A | 11/1984 | Roberts et al. ............... 370/85 |
| 5,086,470 A | 2/1992 | Ballance ...................... 380/48 |
| 5,243,627 A | 9/1993 | Betts et al. ................... 375/39 |
| 5,452,333 A * | 9/1995 | Guo et al. .................... 375/371 |
| 5,710,649 A | 1/1998 | Mollenauer ................. 359/123 |
| 5,802,103 A | 9/1998 | Jeong ........................ 375/220 |
| 5,956,374 A * | 9/1999 | Iwamatsu .................... 375/320 |
| 6,010,788 A | 1/2000 | Kebabjian et al. ........... 428/381 |
| 6,011,441 A | 1/2000 | Ghoshal ....................... 331/55 |
| 6,208,702 B1 | 3/2001 | Ghoshal ...................... 375/354 |
| 6,211,714 B1 | 4/2001 | Jeong ......................... 327/293 |
| 6,316,981 B1 | 11/2001 | Rao et al. .................... 327/298 |
| 6,385,367 B1 * | 5/2002 | Rogers et al. ................. 385/26 |
| 6,403,887 B1 | 6/2002 | Kebabjian et al. ........ 174/110 R |
| 6,448,168 B1 | 9/2002 | Rao et al. .................... 438/598 |
| 6,452,107 B1 | 9/2002 | Kebabjian ............... 174/113 R |
| 6,549,059 B1 | 4/2003 | Johnson ...................... 327/367 |
| 6,664,839 B2 | 12/2003 | Ootake et al. ................ 327/292 |
| 6,684,030 B1 | 1/2004 | Taylor et al. .................. 398/59 |
| 6,820,234 B2 | 11/2004 | Deas et al. ................... 714/814 |
| 6,917,229 B2 * | 7/2005 | Cho .......................... 327/158 |
| 2004/0223566 A1* | 11/2004 | Yamashita ................... 375/354 |

* cited by examiner

*Primary Examiner*—Suresh K Suryawanshi
(74) *Attorney, Agent, or Firm*—Dorsey & Whitney LLP

(57) ABSTRACT

A method and system for coupling digital signals from a first location to a second location through respective signal lines includes a mode detector that detects each of the transitions of the digital signals. The mode detector determines respective propagation times of the signals through the signal lines based on the relative transitions of the signals. The mode detector then applies delay values to delay circuits that couple the signals to the signal lines with respective delays corresponding to the delay values. The delay values may be determined by coupling a predetermined pattern of test signals through the signal lines and determining which delay values allow the signals to be most accurately captured at the second location.

43 Claims, 7 Drawing Sheets

SYSTEM AND METHOD FOR REDUCING JITTER OF SIGNALS COUPLED THROUGH ADJACENT SIGNAL LINES

TECHNICAL FIELD

This invention relates to electronic devices in which digital signals are coupled through signal lines adjacent each other, and, more particularly, to a system and method for reducing jitter in the signals that is caused by variations in the propagation velocities of the signals.

BACKGROUND OF THE INVENTION

In many electronic devices, signals are coupled through parallel signal lines that are positioned closely adjacent each other. For example, in a double in-line memory module ("DIMM") 10 shown in FIG. 1, a plurality of memory devices, generally synchronous dynamic random access memory ("SDRAM") devices 14, are mounted on an insulative substrate 16. Each of the SDRAM devices 14 has a set of external terminals that are coupled to respective contacts of edge an connector 18 through a set of buses 20 composed of a large number conductors running closely adjacent each other. Conductors of this type are commonly referred to a "microstrip" conductors, and they essentially function as transmission lines.

As is well known in the art, the transmission lines formed by the microstrip conductors in the buses 20 behave essentially as series inductors and resistors, and shunt capacitors. As shown in FIG. 2, signal $S_1$ is generated by a signal source 36 having an output impedance represented by a resistor 38, and is coupled through a conductor 40. The conductor 40 is coupled to a termination voltage VTT through a termination impedance represented by a resistor 46. Another conductor 48 is represented by these same components, which have been provided with the same reference numerals. Intermediate sections 50 of the conductor 40, 48 are often parallel and closely adjacent each other. As explained in greater detail below, placing conductors adjacent to each other in this manner can create jitter in signals coupled through the conductors 40, 48.

Returning to FIG. 1, the conductors in the DIMM 10 couple command signals, address signals, write data signals, clock signals and often a write strobe signal to the SDRAM devices 14, and they couple read data signals and often a read strobe signal from the SDRAM devices 14. As the operating speeds of electronic devices, such as memory devices, continues to increase, the relative timing of digital signals has become even more critical. For example, in the DIMM 10 of FIG. 1, the write data signals are latched into the SDRAM devices 14 responsive to a write strobe signal. The write data signals are normally in phase with a system clock signal while the write strobe signal is the quadrature of the system clock signal. Transitions of the write strobe signal thus occur in the center of a data valid "eye" in which the write data signals are valid. As the operating speed of the SDRAM devices 14 continues to increase, the size of the data valid eye has become smaller, thus making the timing of the write strobe signal relative to the write data signals even more critical.

The timing of a digital signal is affected by "jitter," which is high frequency phase noise that cause rapid changes in the timing at which transitions of the digital signal occur. Jitter can be caused by a number of sources, such as noise coupled to digital circuits along with a digit signal, which causes the switching time of the digital circuit to vary in a random manner. Jitter can also be caused by variations in the propagation time of digital signals coupled through signal lines. A pair of microstrip signal lines 70, 72 formed by a pair of conductive traces 74, 76 on a substrate 78 are shown in FIG. 3. The velocity at which signals propagate through the signal lines 70, 72 is proportional to the reciprocal of the square root of the dielectric constant of the signal lines 70, 72. Unfortunately, the dielectric constants of the signal lines 70, 72 vary because of the coupling of signal transitions in one line 70, 72 to the other line 70, 72. In particular, the effective dielectric constant of the signal lines 70, 72 will be different in each of the following cases:

When signals in adjacent signal lines 70, 72 transition in opposite directions (i.e., one line transitions high and the other line transitions low);

When signals in adjacent signal lines 70, 72 transition in the same direction; and When a signal in one of the signal lines 70, 72 transitions and a signal the other line does not transition.

As a result of these variations in the effective dielectric constants of the signal lines 70, 72, the time required for signals to propagate through the signal lines also varies. More specifically, the propagation velocity of the signals are highest when the signals transition in opposite directions. The propagation velocity is slower when one of the signals switches but the other does not. The propagation velocity is even slower when both of the signals switch in the same direction. Thus, for example, if the signal lines 70, 72 couples write data signals to one of the SDRAM devices 14 (FIG. 1), and a write data strobe is also coupled to the SDRAM devices 14, the relative timing of the write data signals relative to the write data strobe signal will vary depending on the relationship between the transitions of the write data signals. As a result, the transition of the write strobe signal may occur at the center of the data valid eye if the write data signals transition in the same direction, but it may miss the data valid eye if the write data signals transition in opposite directions. Under these circumstances, the correct write data will not be stored in the SDRAM device 14. Similar problems exist in coupling other signals to the SDRAM device 14 as well as coupling signals from the SDRAM device 14.

There is therefore a need for a system and method that can avoid the effects of jitter produced by coupling signals through signal lines that are closely adjacent each other.

SUMMARY OF THE INVENTION

A method and system for coupling first and second digital signals through respective first and second adjacent signal lines first identifies each transition of the first and second signals. Based on the identified transitions, the method and system determines a delay value for the first and second signals. A delay circuit or other device then delays the first and second signals by the delay value before coupling the signals to the first and second signal lines, respectively. The delay of the signals ensures that the time required for the first and second signals propagate to a location in the signal lines is substantially constant, thereby reducing jitter of the signals.

DETAILED DESCRIPTION

Figure 1:
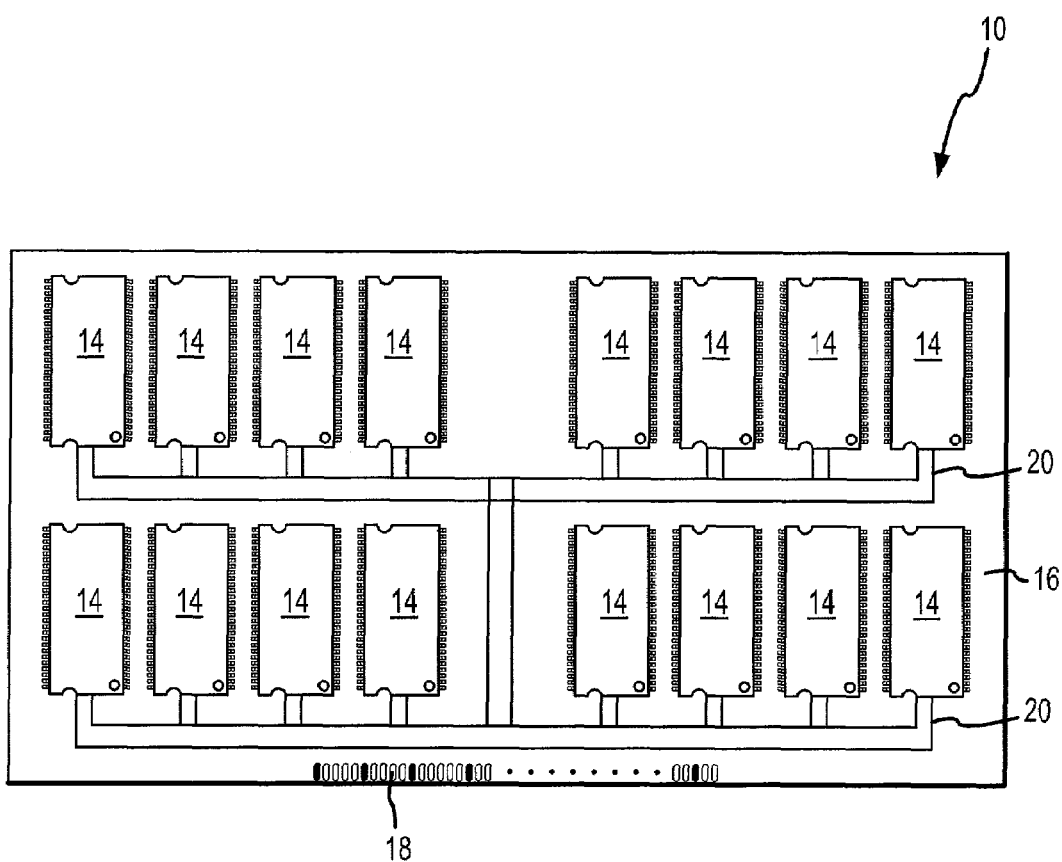
FIG. 1 is a plan view of a conventional double in-line memory module having several memory devices coupled to connectors through microstrip conductors.
Figure 2:
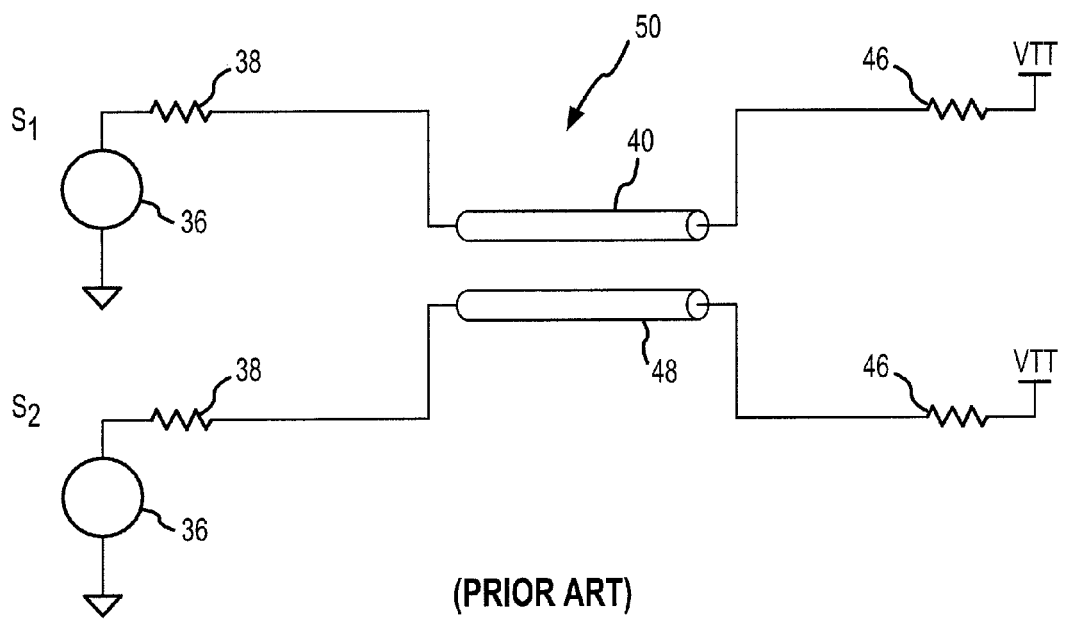
FIG. 2 is a schematic of representative electrical components of two of the microstrip conductors in the memory module of FIG. 1.
Figure 3:
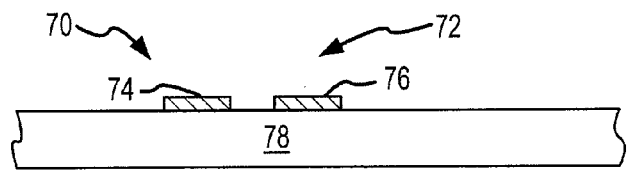
FIG. 3 is a cross-sectional view taken along the line 3-3 of FIG. 1.
Figure 4:
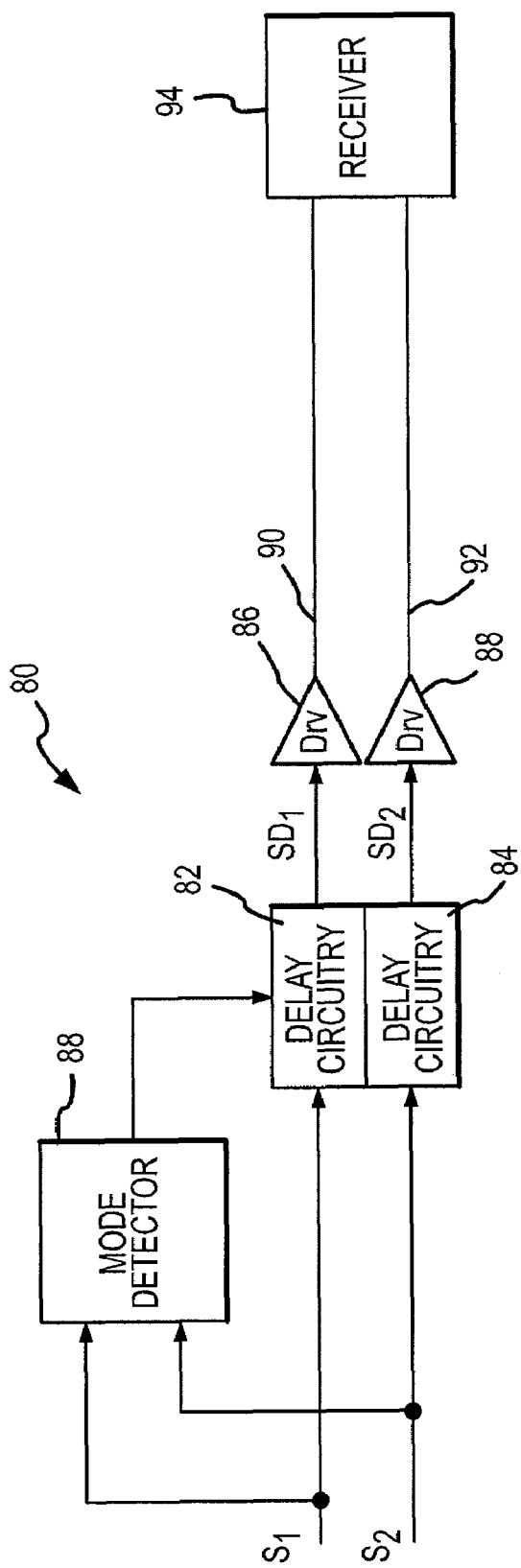
FIG. 4 is a block diagram of a system according to one embodiment of the invention, which adjusts the transmit times of signals as a function of their propagation velocity so the signal to control the timing at which a signal reaches a signal node.

One embodiment of a system 80 for reducing jitter in signals coupled through a pair of adjacent signal lines is shown in FIG. 4. The system 80 includes a delay circuit 82, 84 for each of two signals $S_1$, $S_2$. The signals $S_1$, $S_2$ may be, for example, a pair of read or write data signals or any other digital signal coupled to or from a memory device or other electronic device. The delay circuits 82, 84 are controlled by a mode detector 88 based on the characteristics of the signals $S_1$, $S_2$. The delay circuits 82, 84 delay the signals by a respective delay value and couple respective delayed signals $SD_1$, $SD_2$ to respective drivers 86, 88. The drivers 86, 88 couple the signals $SD_1$, $SD_2$ through respective signal lines 90, 92 to a receiver 94, which may be a memory device.

In operation, the mode detector 88 determines the relative transitions of the signals $S_1$, $S_2$. Based on whether the signals $S_1$, $S_2$ are transitioning in the same direction or in opposite directions or whether either of the signals $S_1$, $S_2$ are not transitioning at all, the mode detector 88 sets a corresponding delay value for the delay circuits 82, 84. More specifically, if the mode detector 88 determines that the signals $S_1$, $S_2$ have transitioned in the same direction, the mode detector 88 sets the delay circuits 82, 84 to provide either no delay or a relatively small delay. If the mode detector 88 determines that the signals $S_1$, $S_2$ have transitioned in opposite directions, the mode detector 88 sets the delay circuits 82, 84 to provide either a relatively large delay. Finally, if the mode detector 88 determines that one of the signals $S_1$, $S_2$ has not transitioned but the other one has, the mode detector 88 sets the delay circuits 82, 84 to provide a moderate delay that is intermediate the delays provided in the other circumstances. The delay circuits 82, 84 delay the signals $S_1$, $S_2$ by appropriate amounts so that they arrive at the receiver 94 at the same time. As a result, the amount of jitter in the signals $S_1$, $S_2$ is substantially reduced, thereby allowing the receiver 94 to operate at a higher speed without encountering data errors.

Figure 5:
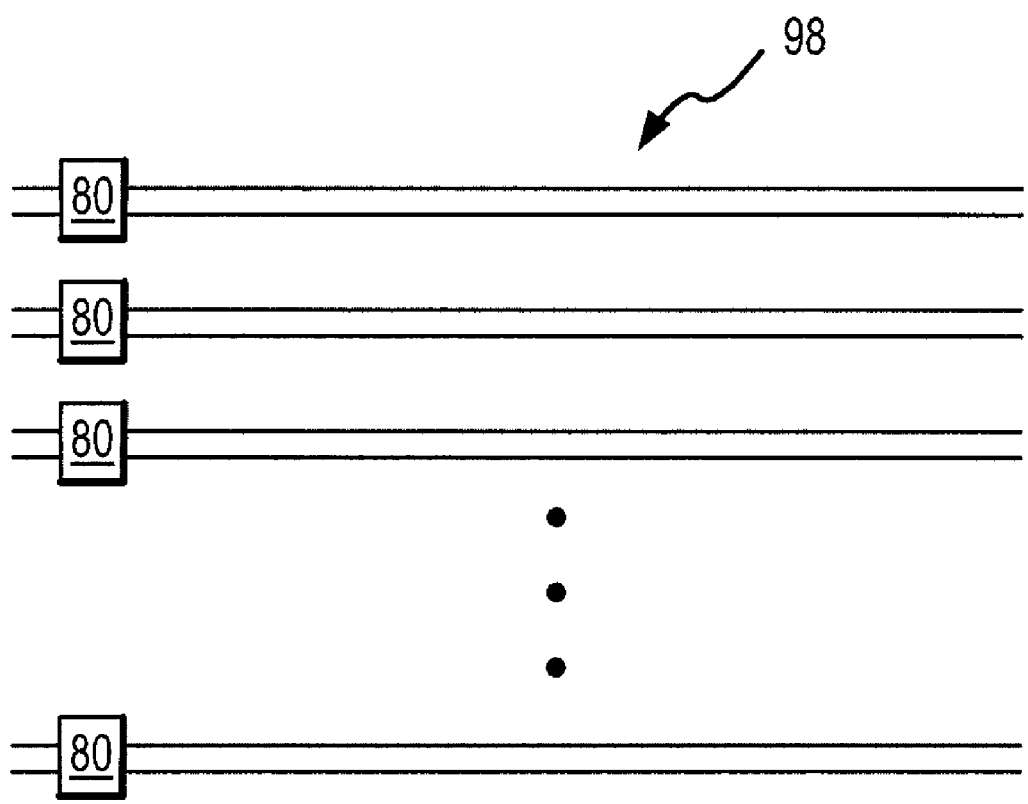
FIG. 5, is a plan view of a bus containing a plurality of signal lines showing one embodiment for dividing the signal lines into closely adjacent signal line pairs, each of which is coupled to a jitter reduction system.

Sets of digital signals are commonly coupled through a large number of respective signal lines known as buses. For example, data signals are coupled through a data bus, and address signals are coupled through an address bus. Under these circumstances, it may not be possible to minimize jitter by simply coupling pairs of signals through the jitter reduction system 80 since the propagation time of a signal coupled through one of the lines can be affected by transitions in the signal line of an adjacent pair. However, as shown in FIG. 5, signal lines of a bus 98 can be divided into closely adjacent signal line pairs, each of which is coupled to a respective one of the jitter reduction systems 80. Although signal transitions in a signal line of an adjacent pair may have some effect on the propagation time through a signal line, the relatively large spacing from the signal line in the adjacent pair minimizes the effect of such transitions. In contrast, the substantially closer spacing of signal lines in each pair results in transitions in one line having a substantially greater effect in the other, but these effects are largely eliminated by the jitter reduction system 80 coupled to that pair.

The magnitude of the delay value provided by the delay circuits 82, 84 will depend on a number of factors in addition to the relative signal transitions in the signal lines 66, 68. A primary factor is the length of the signal lines 90, 92. The appropriate delay value in any situation can be determined using a number of techniques. The delay values can be determined using conventional simulation techniques or empirically by measuring variations in the relative timing of signals $S_1$, $S_2$ coupled through the signal lines 90, 92. Once the delay values have been determined, delay values are selected that compensate for these variations.

Figure 6:
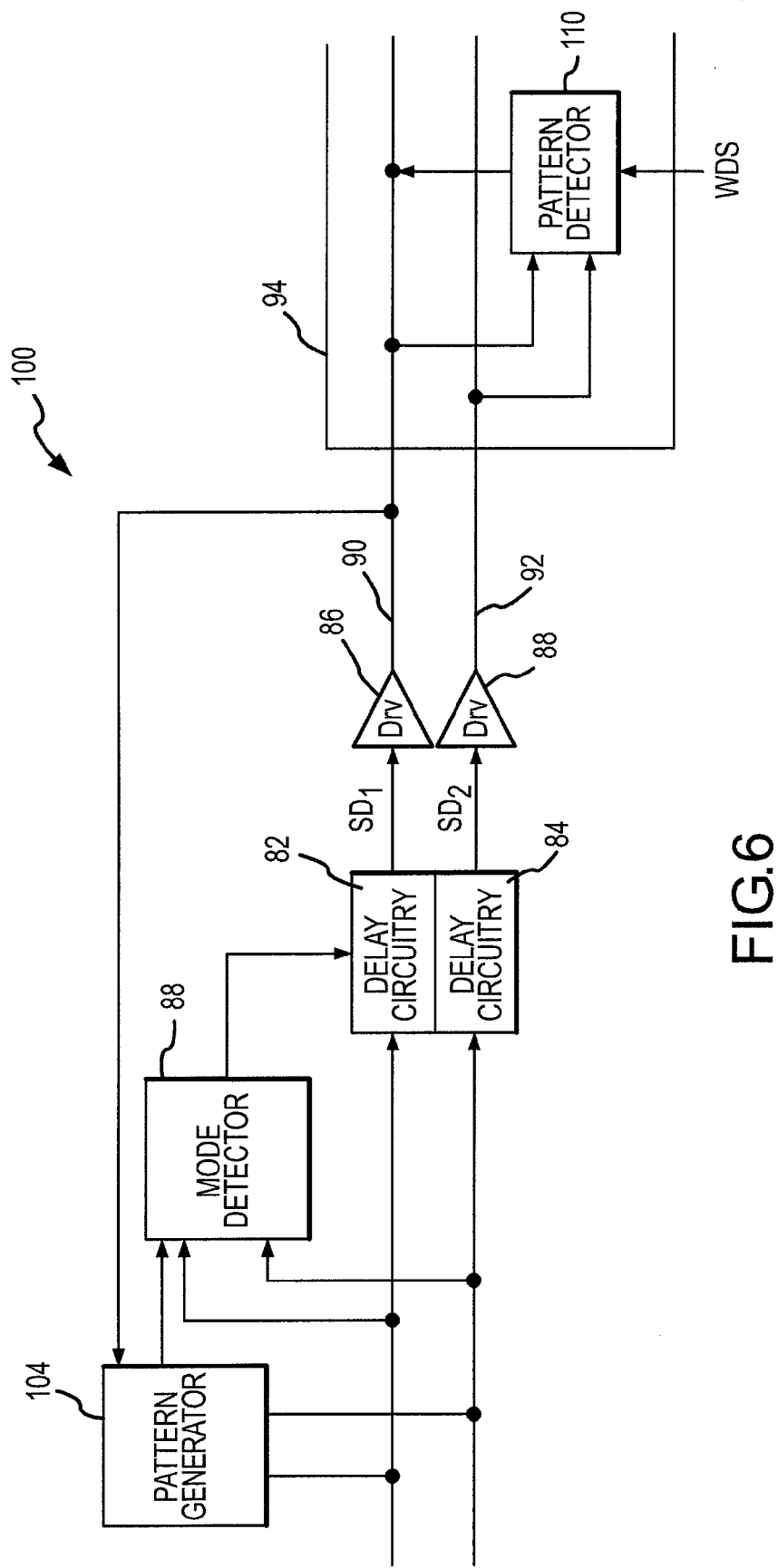
FIG. 6 is a block diagram of one embodiment of an evaluation system that can be used with the jitter reduction system of FIG. 4.

The appropriate delay values can also be determined automatically using an evaluation system 100 as shown in FIG. 6. The evaluation system 100 includes a pattern generator 104 coupled to the inputs of the delay circuits 82, 84. The pattern generator 104 is also coupled to the mode detector 88 to control the delay provided by the delay circuits 82, 84. The receiver 94 includes a pattern detector 110 coupled to the signal lines 90, 92. The pattern detector 110 captures the signals coupled through the signal lines 90, 92 using a write data strobe WDS, and attempts to detect the pattern transmitted by the pattern generator 104 in the captured signals. The pattern detector 110 applies feedback data through the signal line 90 indicating if it was successful in capturing the transmitted pattern. The feedback data are coupled through the signal line 90 to the pattern generator 104.

In operation, the pattern generator 104 generates a pattern of the signals $S_1$, $S_2$ at each of several delay values. In response to the transmission of each pattern of signals $S_1$, $S_2$, the pattern detector 110 transmits the feedback data to the pattern generator 104 indicating whether or not the transmitted pattern was detected. After transmitting the signal pattern at each of a plurality of delay values and receiving feedback data from the pattern detector 110, the pattern generator 104 determines the optimum values of the delay value for each type of signal transition. For example, if, for eight delay values, the pattern detector 110 provides feedback data of F, F, P, P, P, P, P, F (where P is a pass, meaning the signals were properly received an F is a fail, meaning the signals were not properly received), the pattern generator 104 may select the delay value approximately in the midpoint of the delay values in which the transmitted pattern was detected.

Although the evaluation system 100 as shown in FIG. 6 includes a pattern generator 104 that generates a pattern of transitions for both signals $S_1$, $S_2$ and a pattern detector 110 that detects the pattern on both signal lines 90, 92, another embodiment of the evaluation system 100 includes a pattern generator 104 that generates a pattern of transitions for only the signals $S_1$, and a pattern detector 110 that detects the pattern on only signal line 90 since the propagation variations through the signal lines 90, 92 are generally substantially equal to each other.

Figure 7:
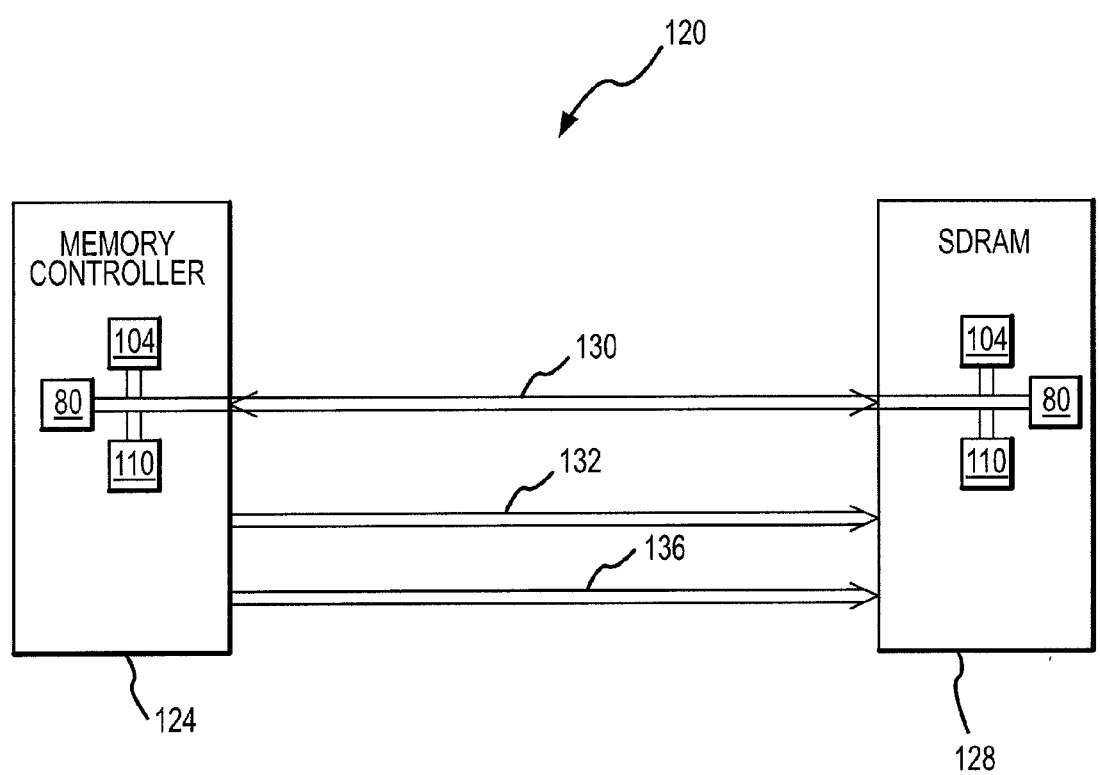
FIG. 7 is a block diagram of a memory system according to one embodiment of the invention using the jitter reduction system of FIG. 4 or a jitter reduction system according to some other embodiment of the invention.

A memory system 120 according to one embodiment of the invention is shown in FIG. 7. The memory system 120 includes a memory controller 124 coupled to one or more SDRAM devices 128 through a data bus 130, an address bus 132 and a command bus 136. The memory controller 124 contains the jitter reduction systems 80, the pattern generators 104, and the pattern detectors 110 for respective pairs of signal lines in a data bus 130. Each of the SDRAM devices 128 also contains the jitter reduction systems 80, the pattern generators 104, and the pattern detectors 110 for respective pairs of signal lines in the data bus 130.

In operation, the pattern generators 104 in the memory controller 124 transmit the predetermined pattern at each of a plurality of delay values for respective pairs of signal lines in the data bus 130. At each of these delay values, the pattern detectors 110 in the SDRAM devices 114 transmit feedback data to the pattern generators 104. The pattern generators 104 use the evaluation feedback data to select respective delay values that will be used in normal operation to couple write data signals through respective pairs of the signal lines in the data bus 130 from the memory controller 124 to the SDRAM devices 114. The jitter reduction systems 80 and pattern generators 104 in each of the SDRAM devices 128 then perform the same operation with the pattern detectors 110 in the memory controller 124. The pattern generators 110 use the feedback data to select respective delay values that will be used in normal operation to couple read data signals through respective pairs of the signal lines in the data bus 130 from the SDRAM devices 128 to the memory controller 124. In normal operation, the write data and read data are coupled between the memory controller 124 and the SDRAM devices 128 with relatively little jitter, thus allowing the SDRAM devices 128 to operate at a higher speed without the risk of erroneous data being written or read.

The jitter reduction systems 80 may also be included in the memory controller 124 for respective pairs of signal lines in the address bus 132 and the command bus 134. However, since it is generally not as critical to couple address and command signals to the SDRAM devices 128 at very high speeds, the jitter reduction systems 80 may be coupled only to the signal lines in the data bus 130.

In an alternative embodiment, the memory controller 124 and the SDRAM devices 128 each include one of the jitter reduction systems 80 for each pair of signal lines in the data bus, but only the memory controller 124 includes the pattern generators 104 and only the SDRAM devices 128 include the pattern detectors 110. In operation, once the pattern generators 104 in the memory controller 124 determines the optimum delay values for each pair of signal lines in the data bus 130, it transmits data specifying these delay values to the SDRAM devices 128. The jitter reduction systems 80 in the SDRAM devices 128 are then programmed to use these same delay values. This embodiment is based on the assumption that the propagation times through each pair of signal lines in the data bus 130 are the same for both read data signals and write data signals.

Figure 8:
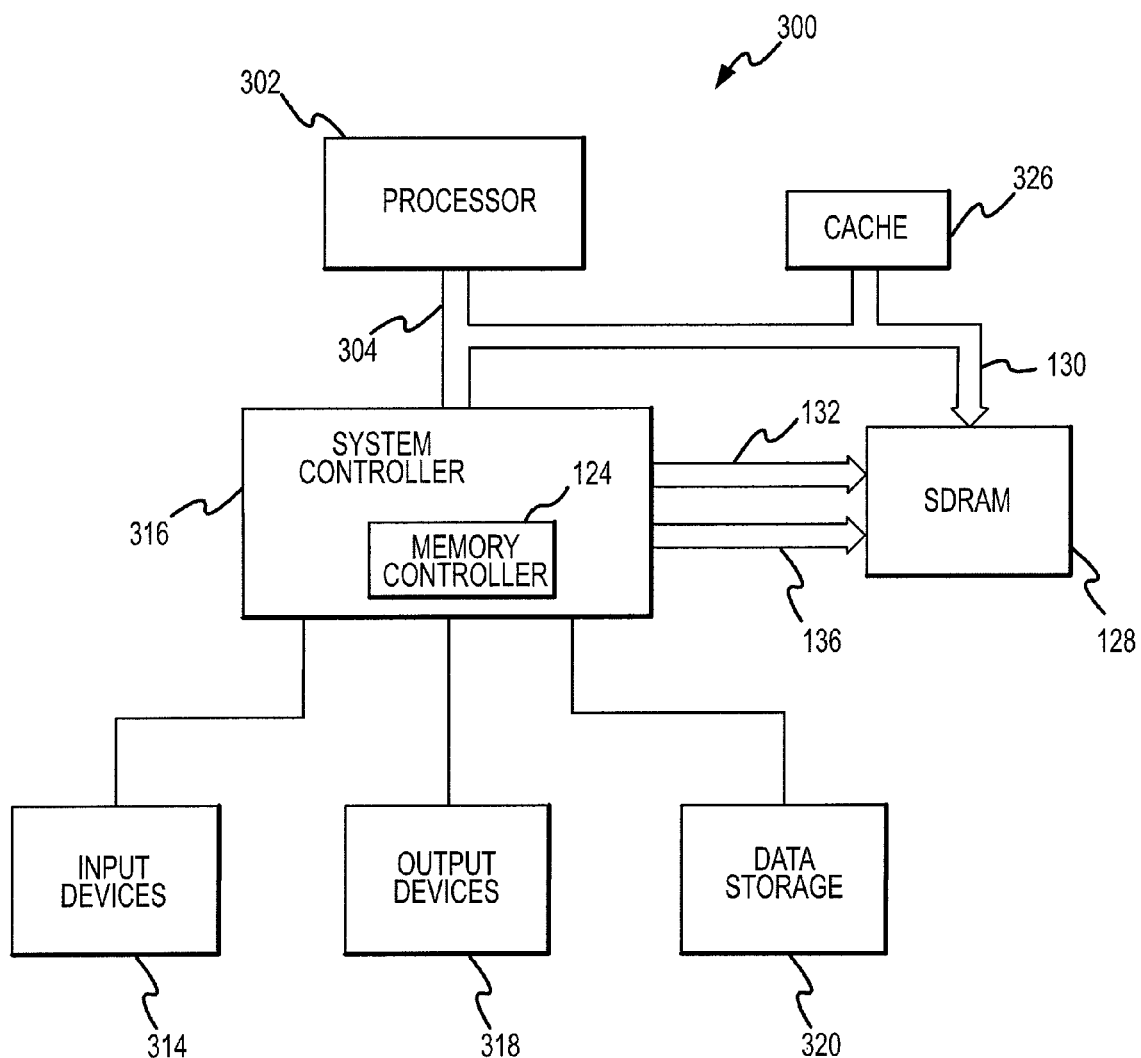
FIG. 8 is a block diagram of one embodiment of a processor-based system using the memory device of FIG. 7 or a memory device according to some other embodiment of the invention.

The memory system 120 shown in FIG. 7 can be used in various electronic systems. For example, it may be used in a processor-based system, such as a computer system 300 shown in FIG. 8. The computer system 300 includes a processor 302 for performing various computing functions, such as executing specific software to perform specific calculations or tasks. The processor 302 includes a processor bus 304 that normally includes an address bus, a control bus, and a data bus. In addition, the computer system 300 includes one or more input devices 314, such as a keyboard or a mouse, coupled to the processor 302 through a system controller 316 to allow an operator to interface with the computer system 300. Typically, the computer system 300 also includes one or more output devices 318 coupled to the processor 302 through the system controller 316, such output devices typically being a printer or a video terminal. One or more data storage devices 320 are also typically coupled to the processor 302 through the system controller 316 to allow the processor 302 to store data in or retrieve data from internal or external storage media (not shown). Examples of typical storage devices 320 include hard and floppy disks, tape cassettes, and compact disk read-only memories (CD-ROMs). The processor 302 is also typically coupled to cache memory 326, which is usually static random access memory ("SRAM"). The computer system 300 also includes the memory system 120 of FIG. 7. More specifically, the system controller 316 includes the memory controller 124, which is coupled to the SDRAM 128 through the data bus 130, the address bus 132 and the command bus 136. As previously explained, the memory controller 124 and the SDRAM 128 each include the jitter reduction systems 50, pattern generators 104 and pattern detectors 110 coupled to respective pairs of signal lines in the data bus 130.

Although the present invention has been described with reference to the disclosed embodiments, persons skilled in the art will recognize that changes may be made in form and detail without departing from the spirit and scope of the invention. Such modifications are well within the skill of those ordinarily skilled in the art. Accordingly, the invention is not limited except as by the appended claims.

We claim:

1. A method of coupling first and second digital signals through respective first and second adjacent signal lines, the method comprising:

identifying each transition of the first and second signals; based on the identified transitions, determining a delay value for the first and second signals; and after identifying each transition of the first and second signals, delaying the transitions of the first and second signals by the determined delay value before coupling the first and second signals to the first and second signal lines, respectively, the first and second signals being delayed so that the time at which the first and second signals propagate to a location in the signal lines is substantially insensitive to variations in the transitions of the first and second signals.

2. The method of claim 1 wherein the act of determining a delay value for the first and second signals comprises determining a delay value of substantially zero if the first and second signals have been identified as transitioning in the same direction.

3. The method of claim 1 wherein the act of determining a delay value for the first and second signals comprises determining a relatively large delay value if the first and second signals have been identified as transitioning in opposite directions.

4. The method of claim 3 wherein the act of determining a delay value for the first and second signals comprises determining a relatively small delay value if the first and second signals have been identified as transitioning in the same direction.

5. The method of claim 4 wherein the act of determining a delay value for the first and second signals comprises determining a delay value intermediate the relatively small value and the relatively large value if the first signal has been identified as transitioning but the second signal has been identified as not transitioning.

6. The method of claim 1 wherein the act of determining a delay value for at least one of the first and second signals comprises:

applying the first and second signals to the first and second signal lines, respectively, over a range of discrete delay values, the first signal being applied to the first signal line in a predetermined pattern;

receiving the first signal at a downstream location in the first signal line;

attempting to detect the predetermined pattern in the received first signal;

making a record of which discrete delay values resulted in the predetermined pattern being detected; and selecting the delay value for the first and second signals based on the record.

7. The method of claim 6, further comprising:

applying the second signal to the signal line in a predetermined pattern over the range of discrete delay values;

receiving the second signal at a downstream location in the second signal line;

attempting to detect the predetermined pattern in the received second signal;

making a record of which discrete delay values resulted in the predetermined pattern in the received second signal being detected; and selecting the delay value for the first and second signals based on the record of which discrete delay values resulted in detecting the predetermined pattern in the first signal and which discrete delay values resulted in detecting the predetermined pattern in the received second signal.

8. The method of claim 7 wherein the predetermined pattern of the first signal is different from the predetermined pattern of the second signal.

9. A system for coupling first and second digital signals from a first location to a second location through first and second signal lines, respectively, the system comprising:

a mode detector coupled to the first and second signal lines at the first location, the mode detector being operable to detect each transition of the first and second signals and determine a delay value for the first and second signals based on the detected transitions;

a first delay circuit coupled to the mode detector, the first delay circuit coupling the first signal to the first signal line at the first location, the first delay circuit coupling the first signal to the first signal line with a delay corresponding to the delay value; and a second delay circuit coupled to the mode detector, the second delay circuit coupling the second signal to the second signal line at the first location, the second delay circuit coupling the first signal to the second signal line with a delay corresponding to the delay value so that the time at which the first and second signals propagate to a location in the signal lines is substantially insensitive to variations in the transitions of the first and second signals.

10. The system of claim 9 wherein the mode detector is operable to determine a value of zero delay for the delay value responsive to the mode detector detecting that the first and second signals have transitioned in the same direction.

11. The system of claim 9 wherein the mode detector is operable to determine a relatively large delay value responsive to the mode detector detecting that the first and second signals have transitioned in opposite directions.

12. The system of claim 11 wherein the mode detector is operable to determine a relatively small delay value responsive to the mode detector detecting that the first and second signals have transitioned in the same direction.

13. The system of claim 12 wherein the mode detector is operable to determine a delay value intermediate the relatively small value and the relatively large value responsive to the mode detector detecting that the first signal has transitioned but the second signal has not transitioned.

14. A system for coupling first and second digital signals from a first location to a second location through first and second signal lines, respectively, the system comprising:

a first delay circuit coupling the first signal to the first signal line at the first location, the first delay circuit coupling the first signal to the first signal line with a delay corresponding to a delay value;

a second delay circuit coupling the second signal to the second signal line at the first location, the second delay circuit coupling the second signal to the second signal line with a delay corresponding to a delay value;

a pattern generator coupled to the first and second delay circuits and to the first signal line at the first location, the pattern generator applying first and second digital test signals to the first and second signal lines, respectively, over a range of discrete delay values, the first digital test signal being applied to the first signal line in a predetermined pattern over the range of discrete delay values;

a pattern detector coupled to the first signal line at the second location, the pattern detector being operable to detect the predetermined pattern at the second location and to provide the feedback data indicative of whether the predetermined pattern is detected at each of the discrete delay values; and a mode detector coupled to the pattern generator and to the first and second signal lines at the first location, the mode detector being operable to select respective delay values for each of a plurality of relative transition characteristics of the first and second signals based on the feedback data from the pattern detector, the mode detector being operable to couple the selected delay values to the first and second delay circuits.

15. The system of claim 14, wherein the pattern generator is operable to apply the second digital test signal to the second signal line in a predetermined pattern over the range of discrete delay values, wherein the pattern detector is operable to detect the predetermined pattern on the second signal line at the second location, and wherein the pattern detector is operable to include in the feedback data an indication of whether the predetermined pattern on the second signal line is detected at each of the discrete delay values.

16. A system for coupling a plurality of digital signals from a first location to a second location, the system comprising:

a plurality of signal lines corresponding in number to the number of digital signals being coupled from the first location to the second location, the signal lines being divided into a plurality of pairs, the signal lines in each pair being positioned substantially closer to each other than they are to any signal line in another pair;

a plurality of mode detectors coupled to respective pairs of the signal lines at the first location, the mode detector being operable to detect each transition of the signals coupled to the signal lines in the respective pair and determine a respective delay value for at least one of the signals based on the detected transitions;

a respective first delay circuit coupled to each of the mode detectors, each of the first delay circuits coupling one of the signals to one of the signal lines in the respective pair at the first location, each of the first delay circuits coupling the signal to the signal line with a delay corresponding to the delay value; and a respective second delay circuit coupled to each of the mode detectors, each of the second delay circuits coupling one of the signals to one of the signal lines in the respective pair at the first location, the second delay circuit coupling the signal to the signal line with a delay corresponding to the delay value so that the timing at which the signals coupled through each pair of signal lines propagate to a location in the signal lines is substantially insensitive to variations in the transitions of the signals.

17. The system of claim 16 wherein each of the mode detectors is operable to determine a value of zero delay for the delay value responsive to the mode detector detecting that the respective signals have transitioned in the same direction.

18. The system of claim 16 wherein each of the mode detectors is operable to determine a relatively small delay value responsive to the mode detector detecting that the respective signals have transitioned in the same direction.

19. The system of claim 16 wherein each of the mode detectors is operable to determine a relatively large delay value responsive to each of the mode detectors detecting that the respective signals have transitioned in opposite directions.

20. The system of claim 19 wherein each of the mode detectors is operable to determine a relatively small delay value responsive to each of the mode detectors detecting that the respective signals have transitioned in the same direction.

21. The system of claim 20 wherein each of the mode detectors is operable to determine a delay value intermediate the relatively small value and the relatively large value responsive to each of the mode detectors detecting that one of the signals in the respective pair has transitioned but the other signal in the respective pair has not transitioned.

22. A memory system, comprising:
a memory controller;
a memory device coupled to the memory controller through at least one pair of signal lines;
a mode detector coupled to the signal lines at the memory controller, the mode detector being operable to detect each transition of signals coupled from the memory controller to the memory device through the signal lines and to determine a delay value for the signals based on the detected transitions;
a first delay circuit coupled to the mode detector, the first delay circuit coupling one of the signals to a respective one of the signal lines at the memory controller, the first delay circuit coupling the signal to the signal line with a delay corresponding to the delay value; and
a second delay circuit coupled to the mode detector, the second delay circuit coupling another one of the signals to a respective one of the signal lines at the memory controller, the second delay circuit coupling the signal to the signal line with a delay corresponding to the delay value so that the time at which the signals propagate to the memory device is substantially insensitive to variations in the transitions of the signals.

23. The memory system of claim 22, further comprising:
a second mode detector coupled to the signal lines at the memory device, the second mode detector being operable to detect each transition of signals coupled from the memory device to the memory controller through the signal lines and to determine a delay value for the signals based on the detected transitions;
a first delay circuit coupled to the second mode detector, the first delay circuit coupling one of the signals to a respective one of the signal lines at the memory device, the first delay circuit coupling the signal to the signal line with a delay corresponding to the delay value determined by the second mode detector; and
a second delay circuit coupled to the second mode detector, the second delay circuit coupling another one of the signals to a respective one of the signal lines at the memory device, the second delay circuit coupling the signal to the signal line with a delay corresponding to the delay value determined by the second mode detector so that the time at which the signals propagate to the memory controller is substantially insensitive to variations in the transitions of the signals.

24. The memory system of claim 22 wherein the memory device comprises a dynamic random access memory device.

25. The memory system of claim 22, further comprising:
a pattern generator coupled to the first and second delay circuits and to the signal lines at the memory controller, the pattern generator applying first and second digital test signals to the signal lines, respectively, over a range of discrete delay values, the pattern generator causing the first digital test signal to be applied to the signal line in a predetermined pattern;
a pattern detector coupled to the first signal line at the memory device, the pattern detector being operable to detect the predetermined pattern at the memory device and to provide a capture indication if the predetermined pattern is detected at each of the discrete delay values; and
wherein the mode detector is coupled to the pattern generator and is operable to select respective ones of the delay values for each of a plurality of relative transition characteristics of the signals coupled to the signal lines from the memory controller based on the capture information from the pattern detector.

26. The memory system of claim 25 wherein the pattern generator is operable to cause the first and second digital test signal to be applied to the signal lines over a range of discrete delay values by coupling delay values to the first and second delay circuits.

27. A memory system, comprising:
a memory device;
a memory controller coupled to the memory device through at least one pair of signal lines;
a mode detector coupled to the signal lines at the memory device, the mode detector being operable to detect each transition of signals coupled from the memory device to the memory controller through the signal lines and to determine a delay value for the signals based on the detected transitions;
a first delay circuit coupled to the mode detector, the first delay circuit coupling one of the signals to a respective one of the signal lines at the memory device, the first delay circuit coupling the signal to the signal line with a delay corresponding to the delay value; and
a second delay circuit coupled to the mode detector, the second delay circuit coupling another one of the signals to a respective one of the signal lines at the memory device, the second delay circuit coupling the signal to the signal line with a delay corresponding to the delay value so that the time at which the signals propagate to the memory controller is substantially insensitive to variations in the transitions of the signals.

28. The memory system of claim 27 wherein the memory device comprises a dynamic random access memory device.

29. The memory system of claim 27, further comprising:
a pattern generator coupled to the first and second delay circuits and to the signal lines at the memory device, the pattern generator applying first and second digital test signals to the signal lines, respectively, over a range of discrete delay values, the pattern generator causing the first digital test signal to be applied to the signal line in a predetermined pattern;

a pattern detector coupled to the first signal line at the memory controller, the pattern detector being operable to detect the predetermined pattern at the memory controller and to provide a capture indication if the predetermined pattern is detected at each of the discrete delay values; and wherein the mode detector is coupled to the pattern generator and is operable to select respective ones of the delay values for each of a plurality of relative transition characteristics of the signals coupled to the signal lines from the memory device based on the capture information from the pattern detector.

30. The memory system of claim 29 wherein the pattern generator is operable to cause the first and second digital test signals to be applied to the signal lines over a range of discrete delay values by coupling delay values to the first and second delay circuits.

31. A memory system, comprising:
a memory controller;
a memory device;
at least one bus coupling the memory controller to the memory device, the at least one bus having a plurality of signal lines divided into a plurality of pairs, the signal lines in each pair being positioned substantially closer to each other than they are to any signal line in another pair;
a plurality of mode detectors coupled to respective pairs of the signal lines at the memory controller, the mode detectors being operable to detect each transition of the signals coupled to the signal lines in the respective pair and to determine a delay value for the signals based on the detected transitions;
a respective first delay circuit coupled to each of the mode detectors, each of the first delay circuits coupling one of the signals to one of the signal lines in the respective pair at the memory controller, the first delay circuit coupling the signal to the signal line with a delay corresponding to the delay value; and
a respective second delay circuit coupled to each of the mode detectors, each of the second delay circuits coupling another one of the signals to one of the signal lines in the respective pair at the memory controller, the second delay circuit coupling the signal to the signal line with a delay corresponding to the delay value so that the time at which the signals propagate to the memory device is substantially insensitive to variations in the transitions of the signals.

32. The memory system of claim 31 wherein the memory device comprises a dynamic random access memory device.

33. A memory system, comprising:
a memory controller;
a memory device;
at least one bus coupling the memory controller to the memory device, the at least one bus having a plurality of signal lines divided into a plurality of pairs, the signal lines in each pair being positioned substantially closer to each other than they are to any signal line in another pair;
a plurality of mode detectors coupled to respective pairs of the signal lines at the memory device, the mode detectors being operable to detect each transition of the signals coupled to the signal lines in the respective pair and to determine a delay value for the signals based on the detected transitions;
a respective first delay circuit coupled to each of the mode detectors, each of the first delay circuits coupling one of the signals to one of the signal lines in the respective pair at the memory device, the first delay circuit coupling the signal to the signal line with a delay corresponding to the delay value; and
a respective second delay circuit coupled to each of the mode detectors, each of the second delay circuits coupling another one of the signals to one of the signal lines in the respective pair at the memory device, the second delay circuit coupling the signal to the signal line with a delay corresponding to the delay value so that the time at which the signals propagate to the memory controller is substantially insensitive to variations in the transitions of the signals.

34. The memory system of claim 33 wherein the memory device comprises a dynamic random access memory device.

35. A processor-based system, comprising:
a processor having a processor bus;
an input device coupled to the processor through the processor bus adapted to allow data to be entered into the computer system;
an output device coupled to the processor through the processor bus adapted to allow data to be output from the computer system;
a memory controller;
a memory device coupled to the memory controller through at least one pair of signal lines;
a mode detector coupled to the signal lines at the memory controller, the mode detector being operable to detect each transition of signals coupled from the memory controller to the memory device through the signal lines and to determine a delay value for the signals based on the detected transitions;
a first delay circuit coupled to the mode detector, the first delay circuit coupling one of the signals to a respective one of the signal lines at the memory controller, the first delay circuit coupling the signal to the signal line with a delay corresponding to the delay value; and
a second delay circuit coupled to the mode detector, the second delay circuit coupling another one of the signals to a respective one of the signal lines at the memory controller, the second delay circuit coupling the signal to the signal line with a delay corresponding to the delay value so that the time at which the signals propagate to the memory device is substantially insensitive to variations in the transitions of the signals.

36. The processor-based system of claim 35, further comprising:
a second mode detector coupled to the signal lines at the memory device, the second mode detector being operable to detect each transition of signals coupled from the memory device to the memory controller through the signal lines and to determine a delay value for the signals based on the detected transitions;
a first delay circuit coupled to the second mode detector, the first delay circuit coupling one of the signals to a respective one of the signal lines at the memory device, the first delay circuit coupling the signal to the signal line with a delay corresponding to the delay value determined by the second mode detector; and
a second delay circuit coupled to the second mode detector, the second delay circuit coupling another one of the signals to a respective one of the signal lines at the memory device, the second delay circuit coupling the signal to the signal line with a delay corresponding to the delay value determined by the second mode detector so that the time at which the signals propagate to the memory controller is substantially insensitive to variations in the transitions of the signals.

37. The processor-based system of claim 35 wherein the memory device comprises a dynamic random access memory device.

38. The processor-based system of claim 35, further comprising:
- a pattern generator coupled to the first and second delay circuits and to the signal lines at the memory controller, the pattern generator applying first and second digital test signals to the signal lines, respectively, over a range of discrete delay values, the pattern generator causing the first digital test signal to be applied to the signal line in a predetermined pattern;
- a pattern detector coupled to the first signal line at the memory device, the pattern detector being operable to detect the predetermined pattern at the memory device and to provide a capture indication if the predetermined pattern is detected at each of the discrete delay values; and
- wherein the mode detector is coupled to the pattern generator and is operable to select respective ones of the delay values for each of a plurality of relative transition characteristics of the signals coupled to the signal lines from the memory controller based on the capture information from the pattern detector.

39. The processor-based system of claim 38 wherein the pattern generator is operable to cause the first and second digital test signal to be applied to the signal lines over a range of discrete delay values by coupling delay values to the first and second delay circuits.

40. A processor-based system, comprising:
- a processor having a processor bus;
- an input device coupled to the processor through the processor bus adapted to allow data to be entered into the computer system;
- an output device coupled to the processor through the processor bus adapted to allow data to be output from the computer system;
- a memory controller;
- a memory device coupled to the memory controller through at least one pair of signal lines;
- a mode detector coupled to the signal lines at the memory device, the mode detector being operable to detect each transition of signals coupled from the memory device to the memory controller through the signal lines and to determine a delay value for the signals based on the detected transitions;
- a first delay circuit coupled to the mode detector, the first delay circuit coupling one of the signals to a respective one of the signal lines at the memory device, the first delay circuit coupling the signal to the signal line with a delay corresponding to the delay value; and
- a second delay circuit coupled to the mode detector, the second delay circuit coupling another one of the signals to a respective one of the signal lines at the memory device, the second delay circuit coupling the signal to the signal line with a delay corresponding to the delay value so that the time at which the signals propagate to the memory controller is substantially insensitive to variations in the transitions of the signals.

41. The processor-based system of claim 40 wherein the memory device comprises a dynamic random access memory device.

42. The processor-based system of claim 40, further comprising:
- a pattern generator coupled to the first and second delay circuits and to the signal lines at the memory device, the pattern generator applying first and second digital test signals to the signal lines, respectively, over a range of discrete delay values, the pattern generator causing the first digital test signal to be applied to the signal line in a predetermined pattern;
- a pattern detector coupled to the first signal line at the memory controller, the pattern detector being operable to detect the predetermined pattern at the memory controller and to provide a capture indication if the predetermined pattern is detected at each of the discrete delay values; and
- wherein the mode detector is coupled to the pattern generator and is operable to select respective ones of the delay values for each of a plurality of relative transition characteristics of the signals coupled to the signal lines from the memory device based on the capture information from the pattern detector.

43. The processor-based system of claim 42 wherein the pattern generator is operable to cause the first and second digital test signals to be applied to the signal lines over a range of discrete delay values by coupling delay values to the first and second delay circuits.

* * * * *